United States Patent [19]

Hatano et al.

[11] Patent Number: 5,475,692
[45] Date of Patent: Dec. 12, 1995

[54] SEMICONDUCTOR MEMORY DEVICE

[75] Inventors: Susumu Hatano, Higashimurayama; Jun Kitano, Kodaira; Kenji Nishimoto, Kokubunji; Shin'ichi Ikenaga, Koganei; Masayasu Kawamura, Kodaira, all of Japan; Yasushi Takahashi, Woburn, Mass.; Takeshi Wada, Akishima, Japan; Michihiro Mishima, Kodaira, Japan; Fujio Yamamoto, Fukuoka, Japan

[73] Assignees: Hitachi, Ltd.; Hitachi VLSI Engineering Corp., both of Tokyo, Japan

[21] Appl. No.: 407,986

[22] Filed: Mar. 22, 1995

Related U.S. Application Data

[63] Continuation of Ser. No. 856,990, Mar. 24, 1992, abandoned.

[30] Foreign Application Priority Data

Apr. 11, 1991 [JP] Japan ................................... 3-106757
May 28, 1991 [JP] Japan ................................... 3-150926

[51] Int. Cl.⁶ .................................................. G06F 11/00
[52] U.S. Cl. ................................................... 371/21.2
[58] Field of Search ............................. 371/21.1, 21.2, 371/21.5, 22.1, 22.5

[56] References Cited

U.S. PATENT DOCUMENTS

| | | | |
|---|---|---|---|
| 5,016,220 | 5/1991 | Yamagata | 365/201 |
| 5,022,007 | 6/1991 | Arimoto et al. | 365/201 |
| 5,117,393 | 5/1992 | Miyazawa et al. | 365/201 |
| 5,185,744 | 2/1993 | Arimoto et al. | 371/21.2 |
| 5,208,778 | 5/1993 | Kumanoya et al. | 365/201 |
| 5,231,605 | 7/1993 | Lee | 365/201 |

FOREIGN PATENT DOCUMENTS

| | | |
|---|---|---|
| 56-16929 | 2/1981 | Japan . |
| 64-62899 | 3/1989 | Japan . |
| 1-282799 | 11/1989 | Japan . |
| 167788 | 9/1991 | Taiwan . |

*Primary Examiner*—Robert W. Beausoliel, Jr.
*Assistant Examiner*—Norman M. Wright
*Attorney, Agent, or Firm*—Fay, Sharpe, Beall, Fagan, Minnich & McKee

[57] ABSTRACT

Herein disclosed is a semiconductor integrated circuit for testing test data of two kinds of non-inverted and inverted statuses of all bits by itself with a prospective data of one kind to compress and output the test results. The semiconductor integrated circuit includes a decide circuit 25 for deciding a first status, in which the prospective data latched by a pattern register and the read data of a memory cell array are coincident, a second status, in which the read data is coincident with the logically inverted data of the prospective data, and a third statuses other than the first and second statuses through an exclusive OR gate to generate signals of 2 bits capable of discriminating the individual statuses. These statuses are informed to the outside of the semiconductor integrated circuit in accordance with high- and low-levels and a high-impedance.

16 Claims, 13 Drawing Sheets

FIG. 6

|  | (1ST STATUS) | (2ND STATUS) | (3RD STATUS) ERROR BIT ↓ |
|---|---|---|---|
| RD | 0 0 1 1 0 0 1 0 | 1 1 0 0 1 1 0 1 | 1 1 0 ① 1 1 0 1 |
| PD | 0 0 1 1 0 0 1 0 | 0 0 1 1 0 0 1 0 | 0 0 1 1 0 0 1 0 |
| EOR11~EOR18 | 0 0 0 0 0 0 0 0 | 1 1 1 1 1 1 1 1 | 1 1 1 0 1 1 1 1 |
| notPD/PD* | 0 | 1 | 1 |
| FAIL/PASS* | 0 | 0 | 1 |

FIG. 7

|  | (1ST STATUS) D READ | (2ND STATUS) D*READ | (3RD STATUS) ERROR BIT ↓ |
|---|---|---|---|
| RD | 0 0 1 1 0 0 1 0 | 1 1 0 0 1 1 0 1 | 1 1 0 ① 1 1 0 1 |
| PD | 0 0 1 1 0 0 1 0 | 0 0 1 1 0 0 1 0 | 0 0 1 1 0 0 1 0 |
| notPD/PD* | 0 | 1 | 1 |
| SELECTOR OUTPUT | 0 0 0 0 0 0 0 0 | 1 1 1 1 1 1 1 1 | 1 1 1 0 1 1 1 1 |
| FAIL/PASS* | 0 | 0 | 1 |

SEMICONDUCTOR MEMORY DEVICE

This application is a continuation application of U.S. Ser. No. 07/856,990, filed Mar. 24, 1992, now abandoned.

BACKGROUND OF THE INVENTION

The present invention relates to a technology for testing a semiconductor integrated circuit equipped with a memory cell array and, more particularly, to a technology which is effective if applied to a semiconductor memory device equipped with a test circuit.

A tester to be used for testing a semiconductor memory device decides the propriety of the semiconductor memory device by sequentially generating a testing data pattern and an address signal, by causing the semiconductor memory device to perform the write/read operations cyclically, and by comparing the read data consecutively with a prospective data by a comparator. However, the number of comparators owned by the tester is limited, and the number of semiconductor memory devices to be tested at one time is necessarily reduced by the number of the parallel output bits of the semiconductor memory device to be tested. Thus, it grows difficult to test a number of semiconductor memory devices efficiently all at once.

Japanese Patent Laid-Open No. 282799/1989 has disclosed the on-chip technique of a test circuit, in which the comparison between the read data from the memory cell array and a protective value and the latch of the comparison result are accomplished in the semiconductor memory device. In addition, a semiconductor memory device having the test circuit packaged therein is disclosed in Japanese Patent Laid-Open No. 62899/1989 or 16929/1981.

SUMMARY OF THE INVENTION

With the test circuit being packaged in the semiconductor memory device, however, the test data for one kind of prospective data is limited to one kind if the comparison with the read data from the memory cell array is only to decide the coincident or incoincidence with the prospective data. Thus, we have found that the packaging is insufficient in the testing efficiency, i.e., the rewriting efficiency of the prospective data and in the reliability of the test. For a highly reliable test, it is desirable to change the writing pattern in the memory cell array. Then, the test can be accomplished while considering the defect of an address decoder, the circuit trouble of the memory cells, and the influences of the capacitive coupling or crosstalk. If these tests are to be realized in the packaged test circuit of the prior art, the prospective data has to be rewritten for each change of test data of 1 bit, so that the number of test steps is increased in the rewrite of the prospective data. Experimentally, in case the read data and the prospective data are to be compared while writing and reading the test data in the memory cell array, at least the test data is divided into two kinds of non-inverted and inverted values if the parallel input/output bits are n bits, the test data to be used is exemplified by a first test data and a second test data which is prepared by inverting all the bits of the first test data.

An object of the present invention is to provide a semiconductor integrated circuit capable of testing two kinds of test data having all bits in non-inverted and inverted statuses by itself with one kind of prospective data and outputting the test result. Another object of the present invention is to provide a semiconductor integrated circuit capable of compressing a test result into 1 bit or 2 bits for the number of bits to be inputted and outputted in parallel and outputting the test result. Still another object of the present invention is to provide a compression circuit capable of testing a number of semiconductor integrated circuits efficiently all at once without being influenced by the number off the parallel output bits of semiconductor memory devices to be tested even if the number is large.

The aforementioned and other objects and novel features of the present invention will become apparent from the following description to be made with reference to the accompanying drawings.

The representatives of the present invention to be disclosed herein will be briefly summarized in the following.

Cecide means (or judgement means) made receptive of a prospective data latched by latch means (or store means) and a read data outputted from a memory cell array for deciding a first status, in which the two data are coincident (or the same), a second status, in which the read data is coincident with the logically inverted data of the prospective data, and a third status other than the First and second statuses and For outputting the individual status in a discriminative manner is included as a testing circuit in a semiconductor integrated circuit. The read data to be fed to the decide means may be the read-data before a column selection or a data amplified after the column has been selected.

In order to give the decide means a function to compress the decision result, the decide means can be constructed of: first logic means for generating a first signal of 1 bit for discriminating the first status or the second status and the third status; and second logic means for generating a second signal for discriminating either the first status and other statuses or the second status and other statuses.

In order to construct the decide means relatively simply, the first logic means can include: a selective logic inverter for inverting the read data of the memory cell array selectively at a bit unit in accordance with the logic value of each bit of the prospective data; and a first logic circuit for discriminating the coincidence/incoincidence of all the bits of the output of the selective logic inverter, and the second logic means can include: a plurality of second logic circuits for deciding the coincidence/incoincidence at a bit unit between the read data of the memory cell array and the prospective data; and a third logic circuit for discriminating whether or not the logic values of all the outputs of the plurality of logic circuits take a constant logic value.

in case the circuit scale of the decide means is to be reduced, the first logic means may include: a plurality of fourth logic circuits for deciding the coincidence/incoincidence of the logic values of the individual bits of the read data of the memory cell array and the prospective data outputted from the latch means; and a fifth logic circuit for discriminating the coincidence/incoincidence of all the bits of the outputs of all the fourth logic circuits, and the second logic means may include a sixth logic circuit sharing the plurality of fourth logic circuits with the first logic means for discriminating whether or not the logic values of all the outputs of the plurality of fourth logic circuits take a constant logic value.

In order to maximize the compression output function by the decide means, the decide means may include an output circuit made receptive of the first signal and the second signal for discriminating and outputting the first to third statuses in accordance with the high- and low-levels and high-impedance status of the signals of 1 bit.

In case the bit number of the data to be obtained once by the reading operation of the memory cell array is larger than that of the data capable of being inputted to or outputted from the memory cell array from the outside by the single write operation, the latch means is exemplified by a shift register of serial input and parallel output type so as to improve the testing efficiency by reducing the number of the reading operations.

In order to arbitrarily select the external terminals to be used for the external outputs of the decision result of the decide means for the memory test on a predetermined system, a selector capable of selecting the output of the decide means and the output of the data read from the memory cells may be provided for outputting the decision result to the selector at a desired external terminal.

In order to minimize the control operations from the outside in the test of a semiconductor integrated circuit, an address counter for generating an address signal for sequentially selecting the memory cells contained in the memory cell array may be included to make use of its output for designating the write/read address of the test data.

The decide means and the latch means can be separately constructed as a compression circuit. In this case, the decide means is provided in plurality such that the decide means are commonly fed with the prospective data latched by the latch means and individually fed with the read data of the memory from a group of external input terminals so that the compressed outputs of the individual decide means may be outputted in parallel to the tester from the individual external terminals.

According to the means thus far described, the decide means for deciding the first status, in which the prospective data latched by the latch means and the read data of the memory cell array are coincident, the second status, in which the read data is coincident of the logically inverted data of the prospective data, and the third status other than the first and second statuses and for outputting the individual statuses in a discriminative manner is operative to output its decision result by one kind of prospective data for two kinds of test data of all the bits in the non-inverted and inverted statuses. Since the information capable discriminating the first to third statuses may be 2 bits or less, the test result can be compressed and outputted into 1 bit or 2 bits for the bit number of the data to be inputted or outputted in parallel. As a result even if the number of the parallel output bits of the semiconductor integrated circuit to be tested is large, a number of semiconductor integrated circuits can be tested efficiently as a whole without being influenced by that number.

BRIEF DESCRIPTION OF THE DRAWINGS

FIG. 6 is an explanatory diagram showing the operations of the example of the decide circuit shown in FIG. 2.

FIG. 7 is an explanatory diagram showing the operations of the example of the decide circuit shown in FIG. 3.

DESCRIPTION OF THE PREFERRED EMBODIMENTS

The embodiments of the present invention will be described sequentially in accordance with the contents of the following items.

[1] Dynamic RAM

Figure 1:
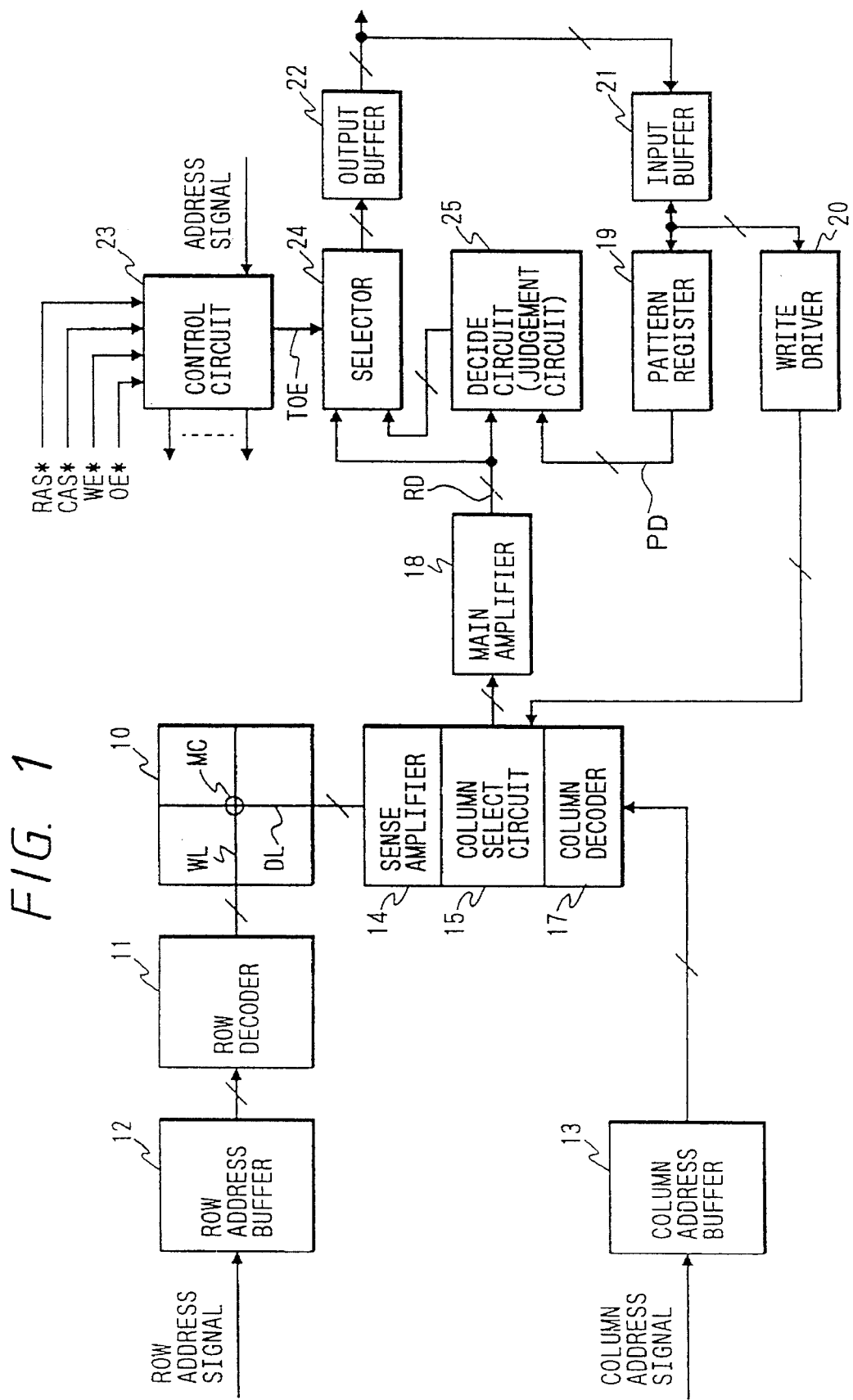
FIG. 1 is a block diagram showing a dynamic RAM according to one embodiment of the present invention.

FIG. 1 shows a dynamic RAM according to one embodiment of the present invention. The dynamic RAM, as shown, is formed over a single semiconductor substrate such as a silicon substrate by the well-known MOS type semiconductor integrated circuit manufacture technique, although not especially limitative thereto. Reference numeral 10 appearing in the same Figure designates a memory cell array which is arranged in a matrix shape with a plurality of one-transistor type dynamic memory cells MC each having an N-channel type select MOSFET and a storage capacity connected in series, although not especially limitative thereto. The memory cell MC has its data input/output terminal coupled to a complementary data line DL laid out by the fold back data line method and its select terminal coupled to a corresponding word line WL, although not especially limitative thereto. Incidentally, one memory cell MC, one complementary data line DL and one word line WL are representatively shown in the Figure. As a matter of fact, however, a number of memory cells are arranged in the matrix shape at the intersecting positions of the numerous complementary data lines and word lines which are arranged to intersect in X and Y directions.

Numeral 12 designates a row address buffer for outputting a row address signal fed from the outside, in the form of an internal complementary address signal. Downstream of the row address buffer 12, there is arranged a row decoder 11 for decoding the row address signal outputted from the row address buffer 12. If a predetermined word line WL is driven to a select level on the basis of the output of the row decoder 11 including the word driver, a memory cell having its select terminal coupled to that word line is selected and connected with the corresponding complementary data line. Numeral 13 designates a column address buffer for outputting a column address signal fed from the outside, in the form of an internal complementary address signal. Downstream of this column address buffer 13, there is arranged a column decoder 17 for decoding the column address signal outputted from the column address buffer 13. The column decoder 17 has its output fed to a column select circuit 15. This column select circuit 15 has (not-shown) column select switches provided to correspond to the individual pairs of complementary data lines. The column select switches are commonly connected every eight lines with a predetermined one of the eight pairs of not-shown complementary common data lines, and their select terminals of each group of the eight column select switches connected with the different complementary common data lines are commonly connected with the corresponding output terminals of the aforementioned column decoder 17. If the column select circuit is operated on the basis of the output of the column decoder, the eight pairs of complementary data lines corresponding to the column address signal are connected with the eight pairs of complementary common data lines.

The individual complementary data line pairs are coupled to a static sense amplifier 14, although not especially limitative thereto. This sense amplifier 14 is constructed by coupling the input/output terminals of a CMOS inverter circuits crossly to each other and is activated through a power switch MOSFET made receptive of a sense amplifier operating signal, before the start of a column selecting operation at the time of data reading operation. The minute potential difference to be outputted from the memory cells to the complementary bit lines by the selecting operation of the word lines is amplified by the sense amplifier 14. This operation refreshes the stored information of the memory cells. In the data reading operation, the column select circuit 15 is operated while waiting for the timing, at which the minute potential difference outputted from the memory cells is amplified by the amplification of the sense amplifier 14.

The data of 8 bits read out to the complementary common data lines is further amplified by a main amplifier 18 and is outputted to downstream stages until it is outputted to the outside through an output buffer 22. On the other hand, a write data of 8 bits fed from the outside through an input buffer 21 is amplified by a write driver 20 and is fed to the complementary common data lines. The dynamic RAM of the present embodiment inputs and outputs the data in parallel at a unit of 8 bits with the outside to write and read the data.

The dynamic RAM of the present embodiment has a pattern register 19, a decide circuit 25 (or judgement circuit 25) and a selector 24 packaged therein as circuits for the device test thereby to reduce the burden upon the tester.

The pattern register 15 is laid out in the peripheral portion of the chip, although not especially limitative thereto, and latches the testing prospective data such that the data can be rewritten from the outside. Thus, the prospective data is written through the input buffer 21, and the written prospective data is outputted to the decide circuit 25. According to the present embodiment, the prospective data is of 8 bits.

The decide circuit 25 inputs both a read data RD of the memory cell array 10 outputted from the aforementioned main amplifier 18 and a prospective data PD latched by the aforementioned pattern register 19 and decides a first status, in which the two data RD and PD are coincident, a second status, in which the read data RD is coincident with a logically inverted data PD* (which symbol "*" will mean the "row active" or "signal inversion" hereinafter) of the prospective data PD, and a third status other than the first and second statuses, to output its decision result such that the individual statuses can be discriminated. The decide circuit 25 has its output outputted from the output buffer 22 to the outside through the selector 24. This decide circuit 25 is featured in that it can output the test result by itself with one kind of prospective data for two kinds of test data (of 8 bits) in the non-inverted and inverted statuses of all the bits and can have its output compressed to 2 bit or less, as will be described in more detail hereinafter.

Figure 4:
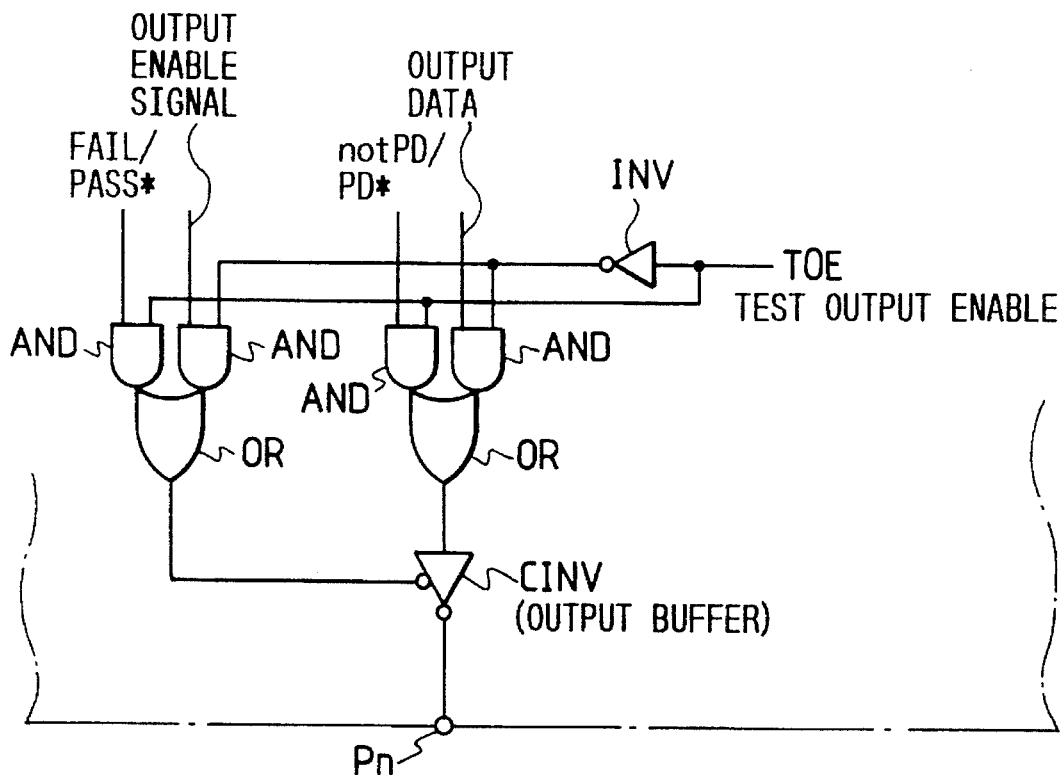
FIG. 4 is a logic circuit diagram showing one example of a select logic for outputting a read data of memory cells and a compression result data selectively to the outside.

The aforementioned selector 24 enables the output of the main amplifier 18 and the output of the decide circuit 25 to be selectively transmitted to the output buffer 22 at the downstream stage and selects the output of the main amplifier 18 in the ordinary operation mode of the dynamic RAM of the present embodiment and the output of the decide circuit 25 in the compression test mode. This selecting control is accomplished by a signal such as a compression test output enable signal TOE outputted from a control circuit 23. In case the less significant one of the external data input/output terminals is assigned, for example, to the output of the decide circuit 25, a selector logic, as represented of 1 bit in FIG. 4, can be adopted as to an external data input/output terminal Pn to be used for the output of the test result, too. No external terminal especially for the test output need be provided by making use the aforementioned selector 24 for the output of the test result. In case an external terminal is left unused in the package of the dynamic RAM, it can be assigned as one especially for the output of the test result. In this case, the selector 24 can be dispensed with, but an output buffer has to be added especially for the test output. Incidentally, the selector logic of 1 bit of FIG. 4 is constructed of an AND circuit AND, an OR circuit OR, an inverter INV and a clocked inverter CINV.

The reference numeral 23 designates a control circuit for controlling the setting of the operation mode of the dynamic RAM and the generation of an internal operation timing signal. This control circuit 23 is fed with both a variety of control signals such as a row address strobe signal RAS* for instructing the validity of a row address signal and a chip selection, a column address strobe signal CAS* for indicating the validity of a column address signal, a write enable signal WE* for instructing a data write, or an output enable signal OE* for indicating the external output of data, and several bits of an address signal, so that an internal operation mode and the internal operation timing signal are generated on the basis of combination of those signal levels.

The test mode in the dynamic RAM of the present embodiment is exemplified by a compression test mode, a VPL application test mode and a VBB stop test mode, although not especially limitative thereto. The compression test mode is one using the aforementioned decide circuit 25. The VPL application test mode is one for stressing and operating a circuit element by Feeding a supply voltage as the plate potential. The VBB stop test mode is one for operations by stopping the operation of the VBB generator.

The compression test mode is set by setting the column address strobe signal CAS* and the write enable signal WE* to a low level and by by setting the row address strobe signal RAS* to the low level while the output enable signal OE* being at a higher level (i.e., an extra-high level) than that of the supply voltage, although not especially limitative thereto. The compression test mode may be released by setting the column address strobe signal CAS* to the low level before the row address strobe signal RAS* is set to the low level. Incidentally, the remaining test modes are set by setting the row address strobe signal RAS* to the low level in the so-called "WCBR" (a write enable signal and a column address strobe signal before a row address strobe signal), namely, while the column address strobe signal CAS* and the write enable signal WE* being at the low level, and their kinds are determined by the logical combination of predetermined bits of the address signals, e.g., the less-significant address bits.

[2] Decide Circuit of 1-Bit Compression Output Type

Figure 2:
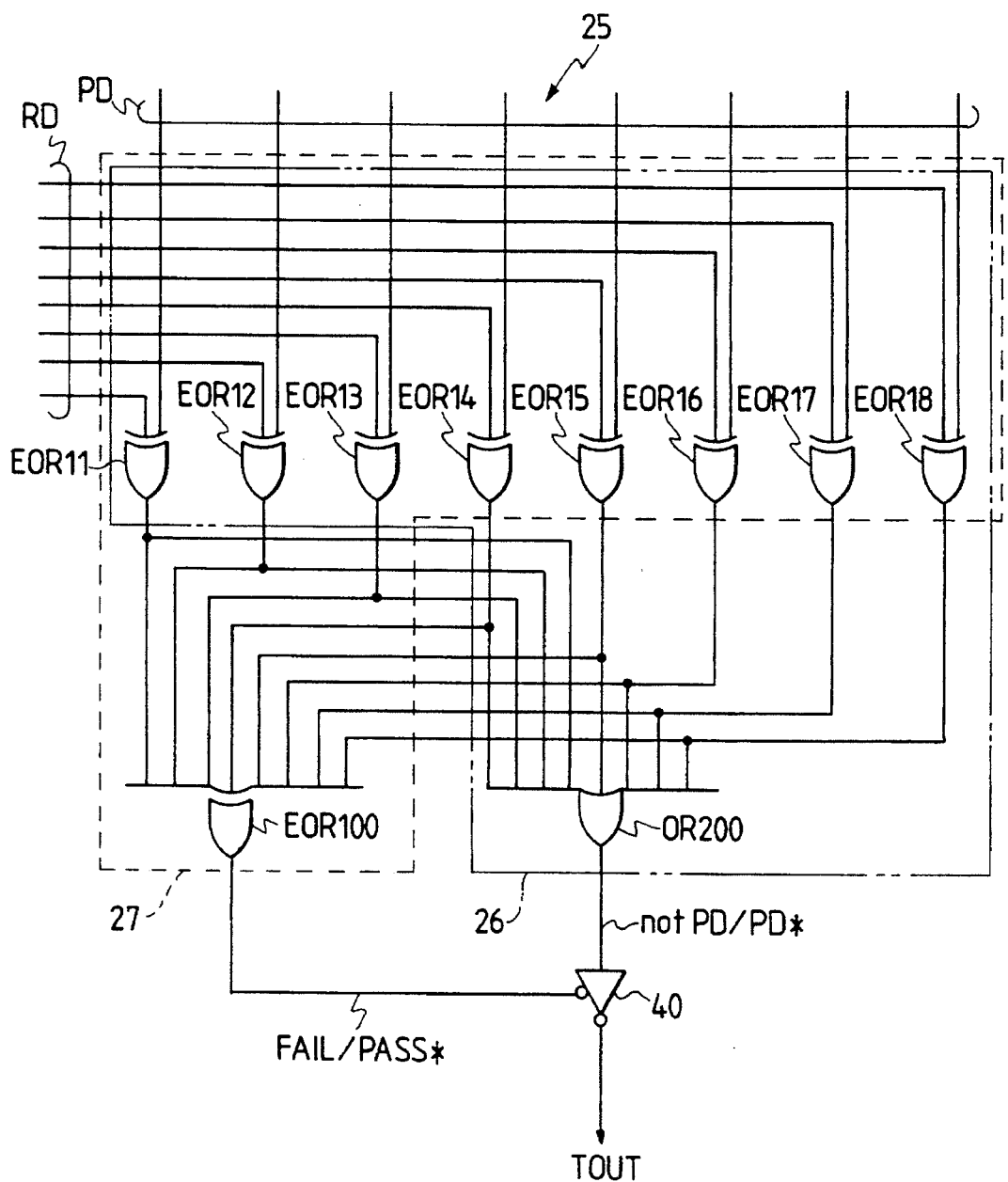
FIG. 2 is a logic circuit diagram showing one example of a decide circuit.

FIG. 2 shows one example of the aforementioned decide circuit 25. The decide circuit, as shown in the same Figure, is exemplified by outputting the compression result of a test as a signal of 1 bit, and its own circuit scale is reduced.

The decide circuit 25 is composed of: a first logic circuit 27 (i.e., one example of the first logic means) for generating a signal FAIL/PASS* (i.e., one example of the first signal) for discriminating the first status, in which both the read data RD of the memory cell array 10 and the prospective data PD latched by the aforementioned pattern register 19 are coincident, or the second status, in which the read data RD is coincident with the logically inverted data PD* of the prospective data PD, and the third status other than the first and second statuses; a second logic circuit 26 (i.e., one example of the second logic means) for generating a signal notPD/PD* (i.e., one example of the second signal) for discriminating the first status and other statuses; and a clocked inverter 40 (i.e., one example of the output circuit) made receptive of the first signal and the second signal for outputting the first to third statuses discriminatively in accordance with the high level, low level and high-impedance status of a signal TOUT of 1 bit.

Figure 5:
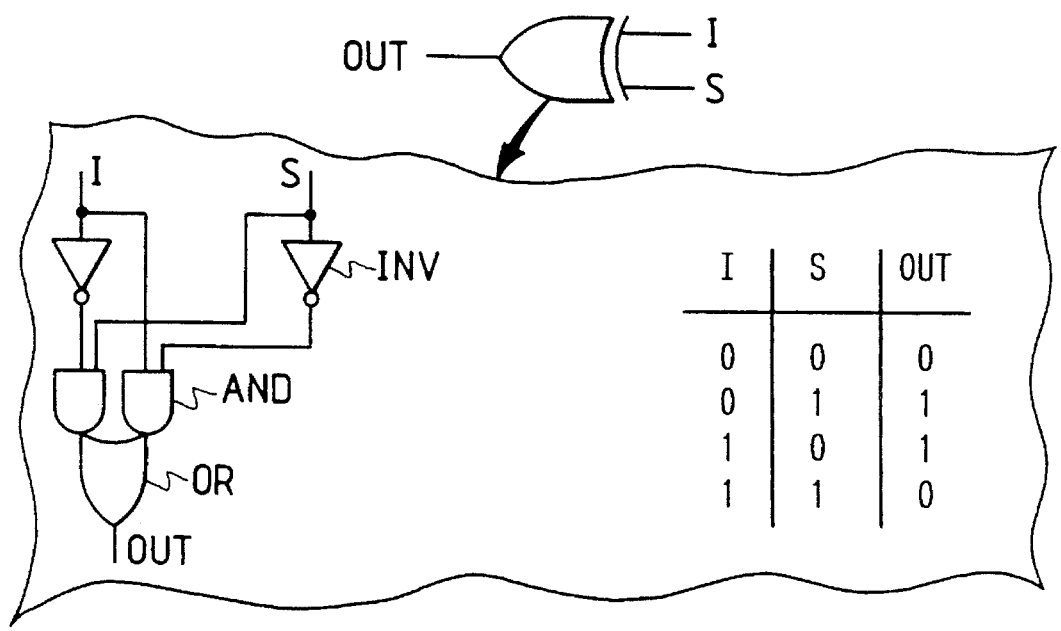
FIG. 5 is an explanatory diagram showing one example of an exclusive OR circuit.

The first logic circuit 27 is composed of: eight exclusive OR circuits EOR11 to EOR18 (i.e., one example of the fourth logic circuit) for deciding the coincidence/incoincidence of the logic values of the individual bits at a bit unit between the read data RD of the memory cell array 10 and the prospective data PD outputted from the pattern register 19; and an exclusive OR circuit EOR100 (i.e., one example of the fifth logic circuit) for discriminating the coincidence/ incoincidence of all the bits of the outputs of all the exclusive OR circuits EOR11 to EOR18. The second logic circuit 26 is constructed by sharing the eight exclusive OR circuits EOR11 to EOR18 with the foregoing first logic circuit 27 and is composed of an OR circuit OR200 (i.e., one example of the sixth logic circuit for discriminating whether or not the logic values of all the outputs of the exclusive OR circuits EOR11 to EOR18 take a constant logic value (e.g., "1" in this instance). Incidentally, one specific example of the exclusive OR circuits and its input/output true value are shown in FIG. 5. This exclusive OR circuit is composed of an AND circuit AND, an OR circuit OR and an inverter INV.

Next, the operations of the aforementioned decide circuit shown in FIG. 2 will be described in the following with reference to FIG. 6.

If the aforementioned compression mode is set, the prospective data PD is written in the pattern register 19 through the input buffer 21 when in a first writing operation instructed by the tester. According to FIG. 6, the prospective data PD is "00110010". Next, the tester designates addresses to instruct the dynamic RAil to scan the addresses sequentially so that the writing operation and the reading operations are sequentially repeated for each address. At this time, the test data to be written in the memory cell array should not be limited to the same data as the prospective data PD but can be the data having its all bits logically inverted, such as two kinds of "00110010" and "11001101". Although not especially limitative thereto, the tester can also either write the two kinds of test data alternately at each address of the memory cells or write in accordance with the Z-marching method, in which the test data in the non-inverted status are sequentially written in all the memory cells and are then sequentially read out and in which the read addresses are rewritten into the test data in the inverted status.

In case the data RD read out from the memory cell array 10 and the prospective data PD of the pattern register 19 are completely identical (i.e., in the first status), all the bits of the outputs of the exclusive OR circuits EOR11 to EOR18 are set to "0". In case the data RD is the inverted data PD* of the prospective data PD (i.e., in the second status), all the bits of the outputs of the exclusive OR circuits EOR11 to EOR18 are set to "1". In case the relation between the data RD and the prospective data PD is another (i.e., in the third status), the outputs of the exclusive OR circuits EOR11 to EOR18 are in a random bit row, in which the values "1" and "0" are mixed.

As a result, the signal FAIL/PASS* outputted from the exclusive OR circuit EOR100 is set to "0" in either the first or second status and to "1" in the third status. In other words, if the signal FAIL/PASS* is at "0", it is meant that the read data RD of the memory cell array 10 is the prospective data PD or its inverted data PD* (i.e., in the first status or the second status). In case the signal FAIL/PASS* is at "1", it is meant that the read data RD of the memory cell array is neither the prospective data PD nor its inverted data PD* (i.e., in the third status), and it is accordingly known that a trouble (i.e., FAIL) has occurred.

Moreover, the output signal notPD/PD* of the aforementioned OR circuit OR200 is set to "0" only in case all the bits of the outputs of the exclusive OR circuits EOR11 to EOR18 are at "0", namely, in case the data RD and the prospective data PD of the pattern register 19 are completely identical, but set to "1" in other cases, i.e., in the second status and the third status. As a result, if it is decided from the value "0" of the signal FAIL/PASS* that the read data RD is the prospective data PD or its inverted data PD* (i.e., in the first status or the second status), it is informed that the read status is the first one, if the signal notPD/PD* is at "0", and is the second one if the signal notPD/PD* is at "1".

Although those signals FAIL/PASS* and notPD/PD* could be directly outputted to the outside, in the present embodiment, the signal FAIL/PASS* is fed to the control terminal of the clocked inverter 40 whereas the signal notPD/PD* is fed to the input terminal of the clocked inverter 40, and the decision result is informed as a signal TOUT of 1 bit to the outside. In other words, the FAIL status (i.e., the third status) having been decided in terms of the value "1" of the signal FAIL/PASS* is informed as the high-impedance status of the signal TOUT to the outside. In the PASS status (i.e., the first status or the second status) decided in terms of the value "0" of the signal FALL/PASS*, the level of the signal notPD/PD* is inverted and outputted to the outside so that the outside is informed of the first status, if the signal TOUT is at "1", and the second status if the signal TOUT is at "0" The clocked inverter 40 of FIG. 2 could be realized by the clocked inverter CINV functioning as an output buffer, as shown in FIG. 4.

Here, the aforementioned first to third statuses are the decision results of the data RD which is obtained by reading the memory cell array 10. In the actual operations, there may occur a trouble or disorder, in which all the bits of the test data are accidentally written due to the influences of noises or in which a memory cell at an address such as an adjacent address different from that designated by an address signal is selected due to the trouble of an address decode logic. Even in case of such trouble or disorder, the trouble cannot be found out only in terms of the output level of the signal TOUT so long as the read data RD of the memory cell array 10 is coincident with the prospective data PD or its inverted data PD*. Since, however, the tester for writing the test data recognizes that the writing operation writes the test data coincident with the prospective data PD or equal to the inverted data of the prospective data PD, the existence of such trouble can be recognized by referring to the three values of the signal TOUT. Such recognition of the trouble is realized by adopting the testing procedures, by which at least the test data in the non-inverted and inverted statuses of the logic value are written in and read out. Such trouble cannot be decided by the tester merely by writing and reading one kind of test pattern consecutively. In this sense, it is valuable for improving the reliability and efficiency of a test to decide two kinds of test data in the non-inverted and inverted statuses of all the bits by themselves with one kind of prospective data.

Figure 8:
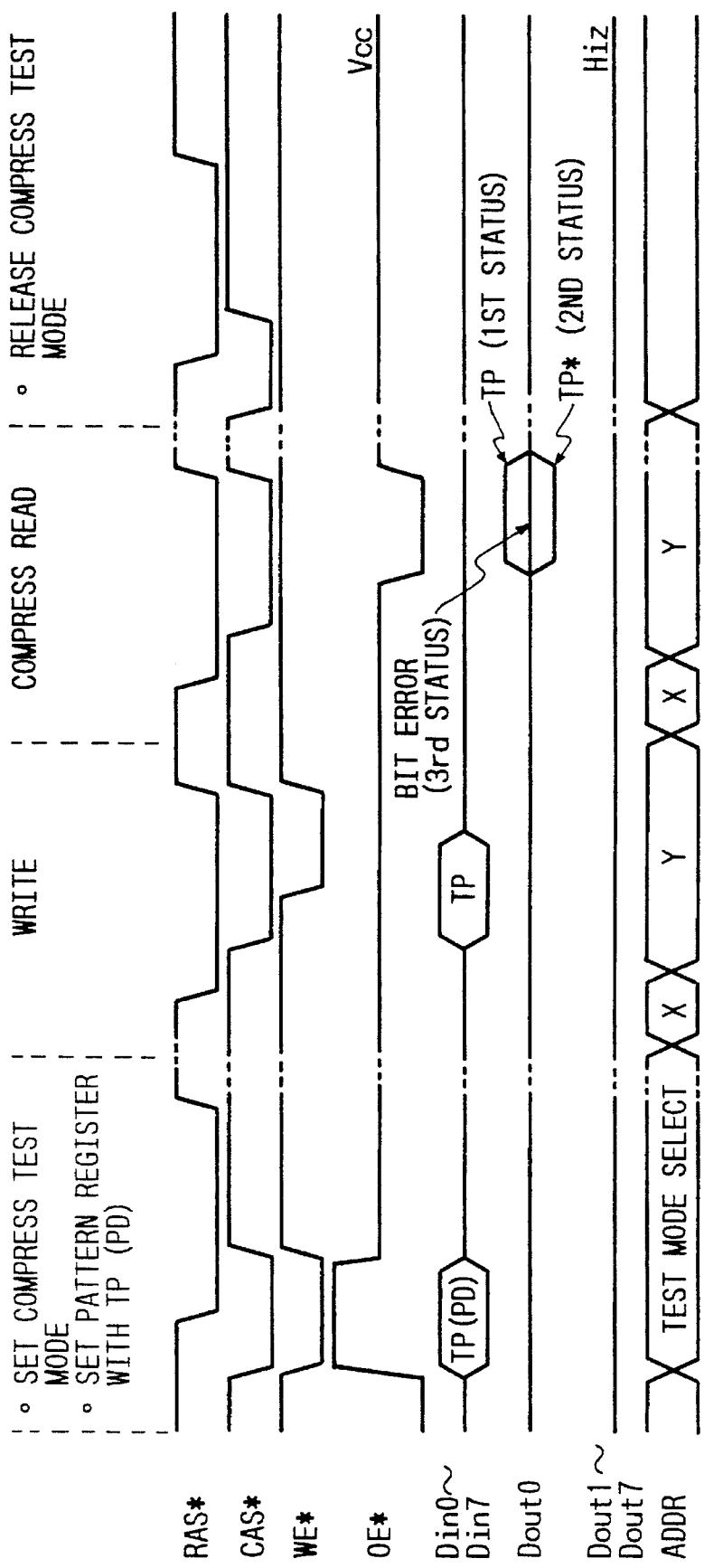
FIG. 8 is a timing chart showing one example of a compression test.

FIG. 8 is a timing chart showing the compression test. In the same Figure: reference characters Din0 to Din7 designate input signal lines leading from the external data input/output terminals to the data input buffer 21; characters Dour0 to Dour7 designate output signal lines leading from the data output buffer 22 to the external data input/output terminals; and characters ADDR designate an address signal fed from the outside. In the shown test, the not-shown tester makes use of a test data designated at TP and a test data TP* prepared by inverting all the bits of the former test data. At this time, the prospective data PD is identical to the test data TP. Upon the compression test the tester sets the compression test mode at first. Specifically, the row address strobe signal RAS* is set to the low level with the column address stroke signal CAS* and the write enable signal WE* being at the low level and with an output enable signal OE being at a level (i.e., an extra-high level) equal to or higher than the supply voltage. In this operation mode setting cycle, the tester outputs the prospective data PD identical to the test data TP and the address signal. As a result, the prospective data PD is written in the pattern register 19. The address signal at this time has a meaning as either an address for designating the pattern register or a control data for designating the writing operation in the pattern register.

The next cycle is the write cycle, in which the test data TP is written in the memory cell designated by the address signal ADDR. Subsequently, the data RD is read out from the memory cell at the same address and is fed together with the prospective data PD to the decide circuit 25, the decision result of which is outputted as the signal TOUT to the output signal line Dour0. The remaining outputs Dout1 to Dour7 are set to a high-impedance status (HiZ). In the next write cycle, although not shown, the test data TP* is written in the memory cell designated by the address signal ADDR. Likewise, in the subsequent cycles, the decision result TOUT of the data RD read out from the memory cell at the same address and the prospective data PD is outputted to the Dour0. The writing operations for the memory cells at sequentially different addresses and the compression reading operations are alternately repeated till the compression test mode is released.

Figure 10:
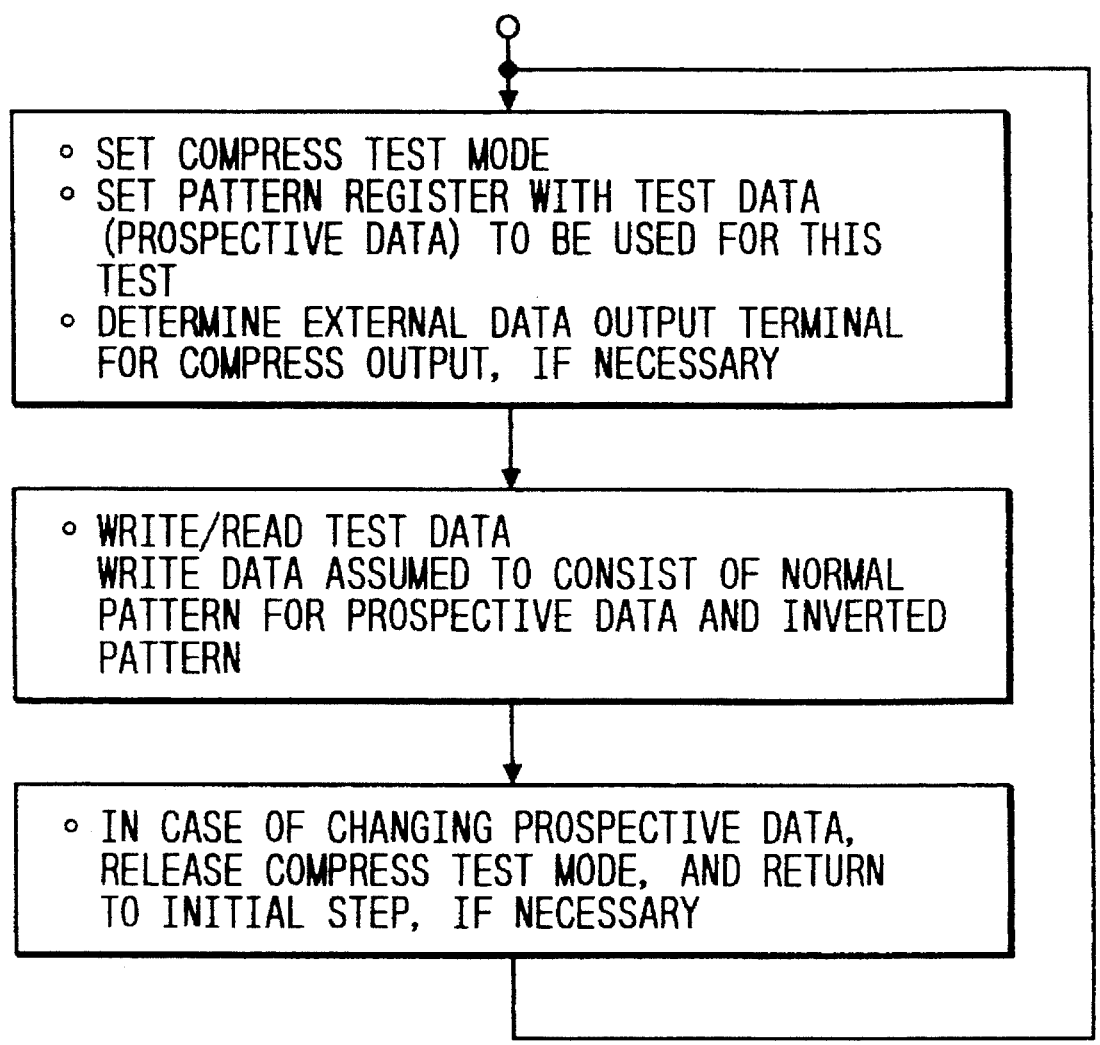
FIG. 10 is a flow chart showing one overall example of the compression test.

The writing operation and the compression reading operations are performed for all the memory cells of the memory cell array 10, or similar processings are accomplished by one round or several rounds by suitably changing the order of the write addresses. After this, if the patterns of the test data TP and TP*, i.e., the patterns of the prospective data PD are to be changed, the column address strobe signal CAS* is set to the low level to release the compression test mode once before the row address strobe signal RAS* is set to the low level. After this, similar processlags are repeated, if necessary. The overall flow chart of the tests in the compression test modes thus far described is shown in FIG. 10.

Figure 9:
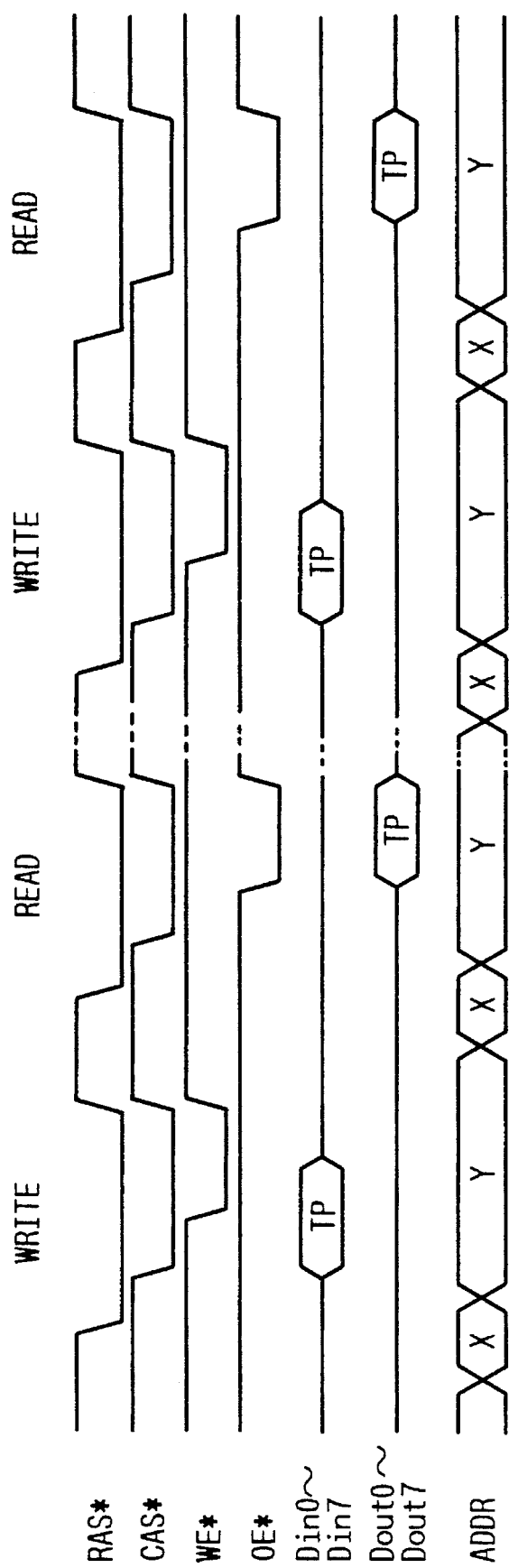
FIG. 9 is a flow chart showing one example of the case, in which tests are performed through ordinary writing and reading operations.

FIG. 9 is a flow chart of the case, in which tests are to be accomplished by the ordinary access operations. In the same Figure, the writing and reading operations of the test data TP and the writing and reading operations of the test data TP* are alternately repeated. In this case, the tester fetches the data of 8 bits outputted by the individual reading operations to decide the validity of the output through the internal comparators. In this case, one dynamic RAM occupies at least eight data input terminals and eight comparison decision circuits of the tester. 1B According to the embodiment thus far described, the following effects can be attained.

(1) The decide circuit 25 decides the first status, in which the prospective data PD latched by the pattern register 19 and the read data RD from the memory cell array 10 are coincident, the second status, in which the read data RD is coincident with the logically inverted data PD* of the prospective data PD, and the third status other than the first and second statuses, and generates the signals FAIL/PASS* and notPD/PD* of 2 bits capable of discriminating the individual statuses to inform the outside of the statuses with the high- and low-level and the high-impedance of the signal TOUT of 1 bit outputted From the clocked inverter 40. As a result, the dynamic RAM can output its own test result to the outside For two kinds of test data in the non-inverted and inverted statuses of all the bits with one kind of prospective data PD.

(2) Thanks to the aforementioned effect, in case a dynamic RAM is tested through the write/read of the test data For the whole memory cell array 10 by writing and reading the two kinds of test data, i.e., the test data in the non-inverted status and the test data in the inverted status alternately at each address of the memory cell MC, it is sufficient to write one kind of prospective data in the pattern register 19 for those two kinds of test data. Thus, the number of test steps can be reduced in the point of rewriting the prospective data in case one dynamic RAM is tested many times by changing the pattern of the test data or by changing the order of the write/read addresses. Likewise, in the Z-marching type test For repeating many times the operations of writing the test data in the non-inverted status sequentially in all the memory cells of the memory cell array and reading the written test data sequentially and rewriting the read addresses into the test data in the inverted status, the step of rewriting the prospective data alternately for each round of the write/read operations for the memory cell array is not required in the least so that the number of steps of rewriting the prospective data can be further reduced.

(3) The decision result output of the decide circuit 25 enables the tester to decide what of the first to third ones the status corresponds to. On the basis of the recognition that the test data written in the dynamic RAM is the non-inverted or inverted one for the prospective data, the tester can recognize such a fault even if the decision result signal TOUT is at the high or low level that the test data is accidentally written in the inverted status in the dynamic RAM by the influences of the noises or that a memory cell at an address such as an adjacent one different from that designated by an address signal due to a trouble of the address decode logic, so that a highly reliable test can be warranted. Such recognition of the trouble can be realized by adopting the test procedures, in which at least the test data in the non-inverted and inverted statuses of the logic value is written and read. Such trouble cannot be decided by the tester merely by writing and reading one kind of test patterns consecutively. In this sense, the two kinds of test data in the non-inverted and inverted statuses of all the bits can be decided with one kind of prospective data, and the result can be outputted. The packaged test circuit of the present embodiment warrants the highly reliable tests while improving the test efficiency.

(4) Since the signals FAIL/PASS* and notPD/PD* generated by the first and second logic circuits are inverted into the signal TOUT of 1 bit by the clocked inverter 40 to recognize the first to third statuses, the test result can be compressed to 1 bit and outputted for the bit number 8 of the data to be inputted and outputted in parallel. As a result, even if the parallel output bit number of the dynamic RAM to be tested is large, numerous semiconductor integrated circuits can be efficiently tested as a whole without being influenced by the large number, so that the testing efficiency can be improved in this respect.

(5) The first logic circuit 27 and the second logic circuit 26 contribute to the reduction of the circuit scale of the decide circuit because they share the exclusive OR circuits.

[3] Decide Circuit of 2-Bit Compression Output Type

Figure 3:
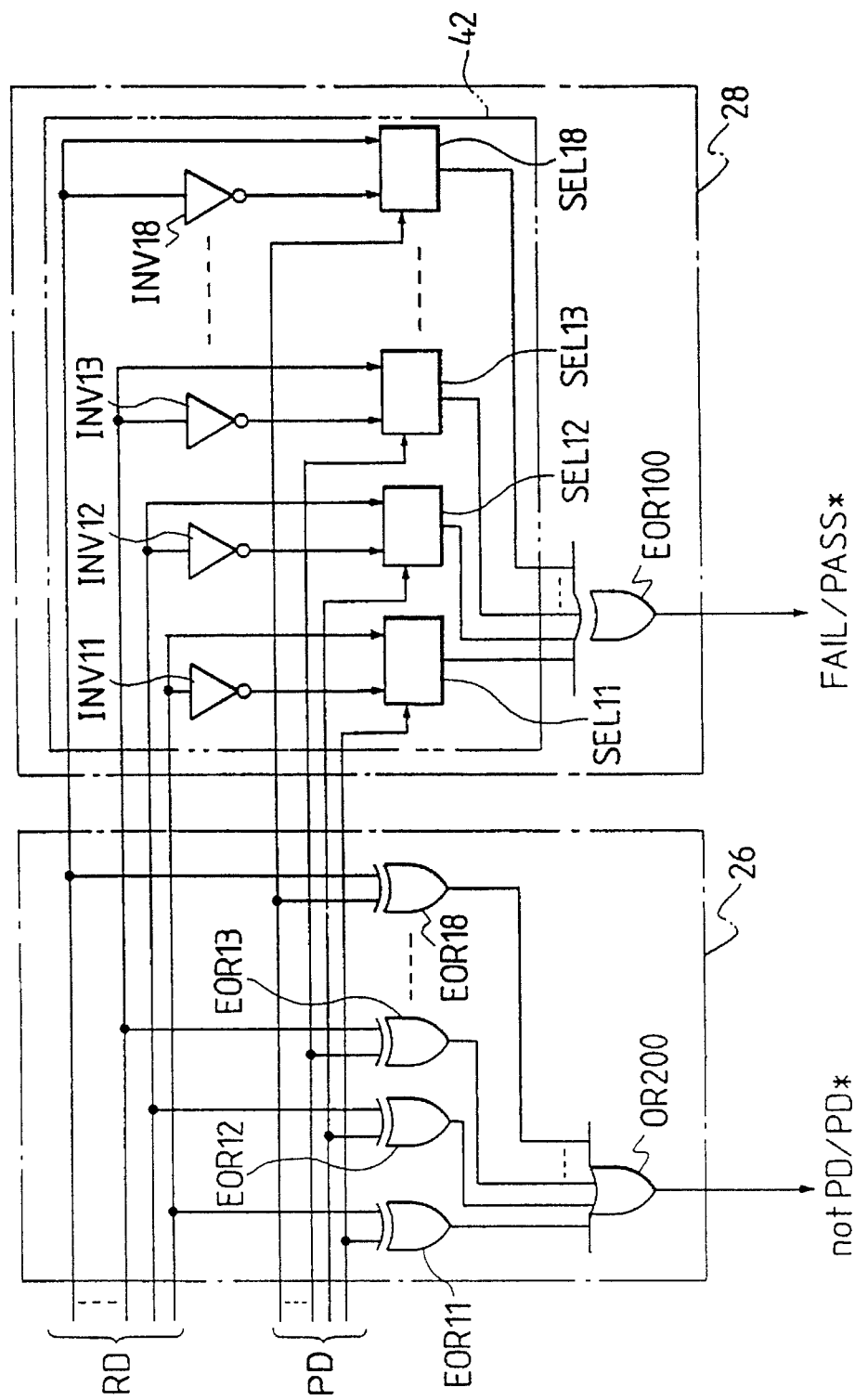
FIG. 3 is a logic circuit diagram showing another example of the decide circuit.

FIG. 3 shows another example of the aforementioned decide circuit 25. The decide circuit, as shown, outputs the compression result of the test as a signal of 2 bits. The decide circuit of FIG. 3 has a structure different from that of the first logic circuit in the number of compression output bits. A first logic circuit 28 of this example generates the signal FAIL/ PASS* as a first signal for discriminating a first status, in which the read data RD of the memory cell array 10 and the prospective data PD latched by the pattern register 19 are identical, a second status, in which the read data RD and the logically inverted data PD* of the prospective data PD are identical, and a third status other than the first and second statuses and has the same function as that of the circuit of FIG. 2. However, the first logic circuit 28 does not share the exclusive OR circuits EOR11 to EOR18 with the second logic circuit 26 but is composed of an intrinsic circuit. Specifically, the first logic circuit 28 is composed of: a selective logic inversion circuit 42 for inverting the logic state of the read data RD of the memory cell array 10 selectively at a bit unit in accordance with the logic state of the latched data PD of the pattern register 19; and the exclusive OR circuit EOR100 for generating an exclusive OR of the output of the inversion circuit 42. At this time, the selective logic inversion circuit 42 is composed of: a plurality of inverters INV11 to INV18 for inverting the logic of the read data RD of the memory cell array 10 at a bit unit; and selectors SEL11 to SEL18 for the logically inverted data by the inverters INV11 to INV18 and the non-inverted data selectively in accordance with the logic state of the latched data RD of the pattern register 19.

Next, the operations of the aforementioned decide circuit shown in FIG. 3 will be described with reference to FIG. 7.

When the aforementioned compression mode is set, in the first writing operation instructed by the tester, the prospective data PD is written in the pattern register 19 through the input buffer 21. With reference to FIG. 7, the prospective data PD is indicated at "00110010". Next, the tester instructs the dynamic RAM to scan the addresses thereby to repeat the writing operation and the reading operation sequentially for each address. At this time, the test data to be written in the memory cell array is not limited to the same one as the aforementioned prospective data PD so that the data having all its bits logically inverted to two kinds: "00110010" and "11001101". The tester can perform the writing operation in the Z-marching method, in which the operations of writing either the two kinds of test data alternately for each address of the memory cells or the test data in the non-inverted state consecutively in all the memory cells, reading the written data sequentially and rewriting the read address into the test data in the non-inverted status are repeated many times.

In case the test data RD read out from the memory cell array 10 is "00110010" (i.e., in the D reading case), in the first logic circuit 28 in the decide circuit 25, those of the read data RD, which are inverted by the inverters INV11 to INV18, are assigned as the bits corresponding to those, for which the prospective data of the pattern register 19 is at "1", by the selecting operations of the selectors SEL11 to SEL18. As a result, the outputs of the selectors SEL11 to SEL18, i.e., the input data of the exclusive OR circuit EOR100 is see to "00000000". Thus, the output of the exclusive OR circuit EOR100 in this case is "0" because all the bits are identical. In case, on the other hand, the test data RD to be read out from the memory cell array 10 is "11001101" (i.e., in the D* reading case), in the decide circuit 25, those of the read data RD, which are inverted by the inverters INV11 to INV18, are assigned as the bits corresponding to those, for which the prospective data PD of the pattern register 19 is at "1", like the above case by the selecting operations of the selectors SEL11 to SEL18. As a result, the outputs of the selectors SEL11 to SEL18, i.e., the input data of the exclusive OR circuit EOR100 is set to "11111111". Thus, the output of the exclusive OR circuit EOR100 in this case is "0" because all the bits are identical. Thus, in case the output of the exclusive OR circuit EOR100 is "0", it is meant that the data written in the memory cell array 10 has been correctly read, namely, that the read data RD is the prospective data PD or its all bit inverted data PD*, so that the propriety (FAIL/ PASS) check is good (i.e., PASS) because of the low level of the signal FAIL/PASS*/ In case, on the contrary, an error occurs at the 4th bit of the read data RD of the memory cell array 10 so that the read data is "11011101", as shown in FIG. 7, the outputs of the selectors SEL11 to SEL18, i.e., the input data of the exclusive OR circuit EOR100 is set to "11101111". As a result, the output of the exclusive OR circuit EOR100 is "1" contrary to the aforementioned case. Thus, in case the output of the exclusive OR circuit EOR100 is "1", it is meant that the data read out From the memory cell array 10 is coincident to neither the prospective data PD nor the inverted data PD*, namely, that the test data written in the memory cell array 10 is not correctly read out, so that the propriety (FAIL/PASS) check is no good (i.e., Failure) because of the high level of the signal FAIL/PASS*.

As has been described above, the output signal FAIL/ PASS* of 1 bit of the exclusive OR circuit EOR100 is reflected by the decision result of whether or not an error bit exists in the read data of the memory cell array. The information thus compressed is outputted to the outside through the selector 24 and the output driver 22 and is inputted to the not-shown tester so that the propriety of the memory cell array 10 can be decided.

Here, with only the check of the aforementioned propriety (FAIL/PASS*), if the outputs of the selectors SEL11 to SEL18 in the D reading case are "11111111" or if the outputs of the selectors SEL11 to SEL18 in the D* reading case are "00000000", the output of the exclusive OR circuit EOR100 is set to "0", and the propriety check is good (i.e., PASS), although such status is intrinsically no good. This state occurs when the test data is accidentally inverted and written by the influences of noises or when the memory cell of an adjacent address different from that designated by the address signals is selected due to the trouble of the address decode logic. Thus, the second logic circuit 26 performs the check with the signal notPD/PD* or outputs the signal notPD/PD* for deciding whether the read test data RD is one coincident with the prospective data PD or another data.

Specifically, the second logic circuit 26 performs the exclusive OR between the read data RD of the memory cell array 10 and the prospective data PD of the pattern register 19 at a bit unit by exclusive OR circuits EDR11 to EDR18, the output OR of which is determined by an OR circuit 29 so that the OR output is used as the notPD/PD* check output. The output of the OR circuit is set to "0", if the read data RD of the memory cell array 10 and the prospective data PD of the pattern register 19 are completely coincident, and to "1" if not. In case of the D reading operation, both the read data RD of the prospective data PD of the pattern register 19 are completely coincident at "00110010" so that the output notPD/PD* of the OR circuit OR200 is set to "0". In case of the D* reading operation, on the contrary, the read data RD of the memory cell array 10 is "11001101", and the prospective data PD of the pattern register 19 is "00110010". Thus, these two data are incoincident so that the output of the OR circuit OR200 is set to "1". The tester itself recognizes whether the present test step is for the D or D* reading operation. In the D reading operation (for reading the data RD to be coincident with the prospective data PD), in case the output notPD/PD* of 1 bit is "1" (i.e., in case the read data RD is the inverted one of the prospective data PD), the status is decided to be no good even if the signal FAIL/PASS* is "0". Likewise in the D* reading operation (for reading the data RD to be coincident with the inverted data of all the bits of the prospective data PD), in case the output notPD/PD* is "0" (i.e., in case the read data RD is coincident with the prospective data PD), the status is decided to be no good even if the signal FAIL/PASS* is "0". As a result, by feeding the tester with the output signal FAIL/PASS* of the first logic circuit and the output signal notPD/PD* of the second logic circuit 26, highly reliable test results can be attained by using two kinds of non-inverted and inverted test data for one kind of prospective data.

Even in the dynamic RAM adopting the decide circuit of FIG. 3, the first, second and third statuses are decided to output the signals FAIL/PASS, and notPD/PD* of 2 bits capable of discriminating the individual statuses so that the dynamic RAM can output its own test results with one kind of prospective data PD for the two kinds of non-inverted and inverted test data of all the bits. This contributes to improvements in the test efficiency and the test reliability like the case of FIG. 2. Since, moreover, the decision result is the signal compressed to 2 bits, even if the number of parallel output bits of the dynamic RAM to be tested is large, numerous semiconductor integrated circuits can be efficiently tested as a whole by the tester without being influenced by that number. In this point, too, the test efficiency is improved. In the decide circuit of FIG. 3, too, the clocked inverter 40 of FIG. 2 and the clocked inverter CINV of FIG. 4 may be adopted to compress their signals FALL/PASS* and notPD/PD* into signals of 1 bit and output them.

[4] Decide Circuit for Processing Read Data before Column Selections

Figure 11:
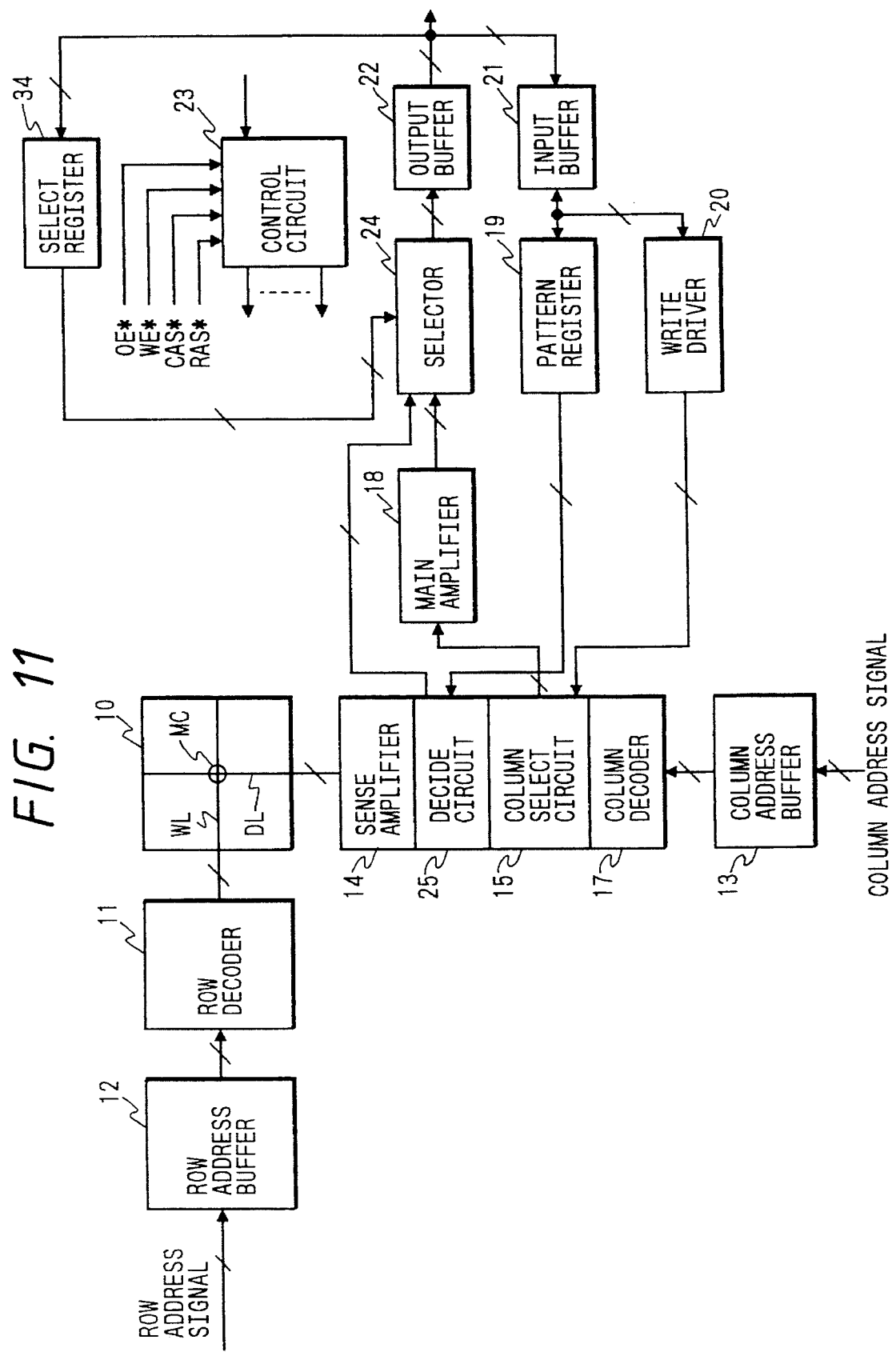
FIG. 11 is a block diagram showing a dynamic RAM according to another embodiment of the present invention and explains one example of the structure capable of deciding the read data by a decide circuit before a column selection and setting a compression output terminal programmably.

FIG. 11 shows a dynamic RAM according to another embodiment of the present invention. In the dynamic RAM shown in FIG. 11, the decide circuit 25 is arranged between the sense amplifier 14 and the column select circuit 15 so that the read data used for deciding the propriety of the memory cell array 10 may be the data of the column select circuit 15 before selected. The structure of the decide circuit 25 at this time can also adopt any of the circuit of FIG. 2 or FIG. 3. For example, in order to cope with the test for switching the non-inverted/inverted status of the test data to be written in the memory cells for each word line, the number of the exclusive OR circuits EOR contained in the structure of FIG. 2 may be increased to correspond to that of the complementary data line pairs, and the prospective data may be commonly fed to all of eight exclusive OR circuits EOR11 to EOR18 of one group. The circuit structure of the detail of the decide circuit can be changed according to other test types.

In the test mode, the word lines WL are selected on the basis of the output of the row decoder 11, whereupon the stored data (i.e., the previously written testing data) of all the memory cell MC coupled to the word lines WL driven to the selection level are read out. The data thus read out are amplified by the individually corresponding sense amplifiers 14 and are inputted to the decide circuit (CMP) 25. This decide circuit 25 decides the propriety of the memory cell array on the basis of both the read data of the memory cell array 10 of the testing data written in the memory cell array 10 and the latched data of the aforementioned latch means. Since, in case of the present embodiment, the decide circuit 25 is arranged at the upstream stage of the column select circuit 15, the number of the memory cells MC to be simultaneously tested is larger than that of the case in which the decide circuit 25 is arranged downstream of the main amplifier 18, as in the case of the foregoing embodiment. For example, in case 8×256 memory cells are coupled to one word line, all of them can be simultaneously tested to shorten the testing time period.

[5] Arbitrary Setting of Compression Output Terminal

The dynamic RAM shown in FIG. 11 can arbitrarily select the external terminals to be used for the external output of the decision result by the decide circuit 25 and is equipped with selector logics of 8 bits, as shown in FIG. 4, in a manner to correspond to all of eight data input/output terminals D0 to D7, for example. These selector logics are contained in the selector 24, as shown in FIG. 11. A select register 34 is further provided as the control information latch means for latching the information for controlling the assignment of a desired bit of the selector logics of 8 bits to the decision result outputs and for feeding it to the individual selector logics. The signals FAIL/PASS* and notPD/PD* generated by the decide circuits 25 are transmitted through the selector 24 to the output buffer 22, through which they can be outputted in 1 bit to the outside. In other words, the output buffer 22 for 1 bit is constructed of the clocked inverter CINV of FIG. 4. The latched content of the select register 34 has information for determining which external terminal the test output enable signal TOE is set to the enable level in a manner to correspond to. This information can be written in the select register 34 by means of the tester in the test mode. Incidentally, in case the signals FAIL/PASS* and notPD/PD* are to be outputted as they are in 2 bits to the outside, both the information for determining the external terminal for outputting the signal FAIL/PASS* and the information for determining the external terminal for outputting the signal notPD/PD* may be separately set in the select register 34.

Figure 15:
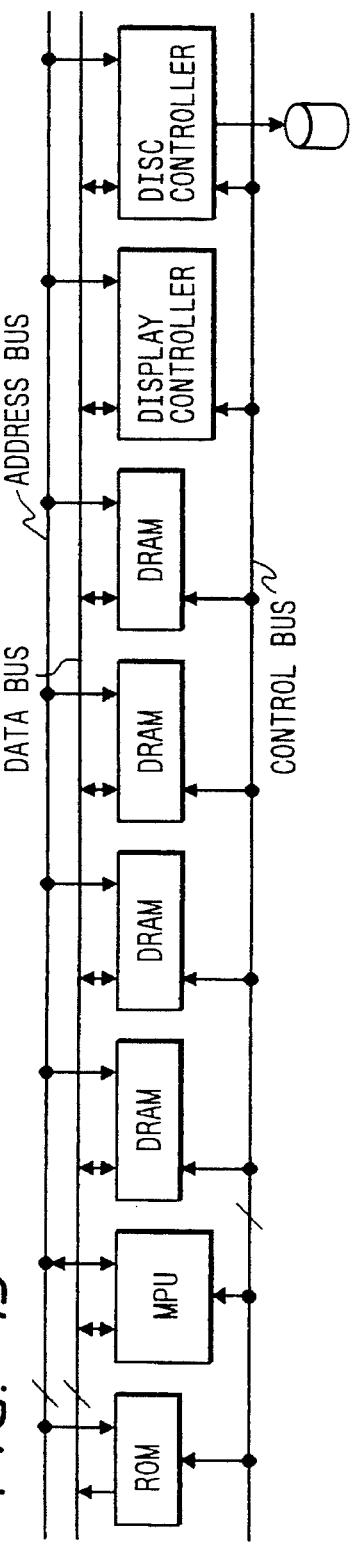
FIG. 15 is an explanatory diagram for a memory test on a system by making use of a compression test mode.

The writing of the information in the select register 34 establishes an intrinsic effect capable of arbitrarily setting the data external terminal to be used for the external output of the propriety deciding information of the memory cell array 10. As a result, when the dynamic RAM is arranged on a specific system, as shown in FIG. 15, the compression test mode can be used for the memory test on that system. When a plurality of dynamic RAMs (i.e., DRAMs) are arranged, as shown in FIG. 1B, the compression test results of the plurality of dynamic RAMs can be incorporated in parallel into the microprocessor through the data bus by making the outputs of the compression test results different for the individual dynamic RAMs, so that the memory tests can be efficiently accomplished. This effect is the more prominent for the larger number of the dynamic RAMs although depending upon the bit number of the data bus. Incidentally, the circuit structure for setting the compression output external terminals arbitrarily can also be applied to the dynamic RAM of FIG. 1.

[6] Packaging of Testing Address Counters

Figure 12:
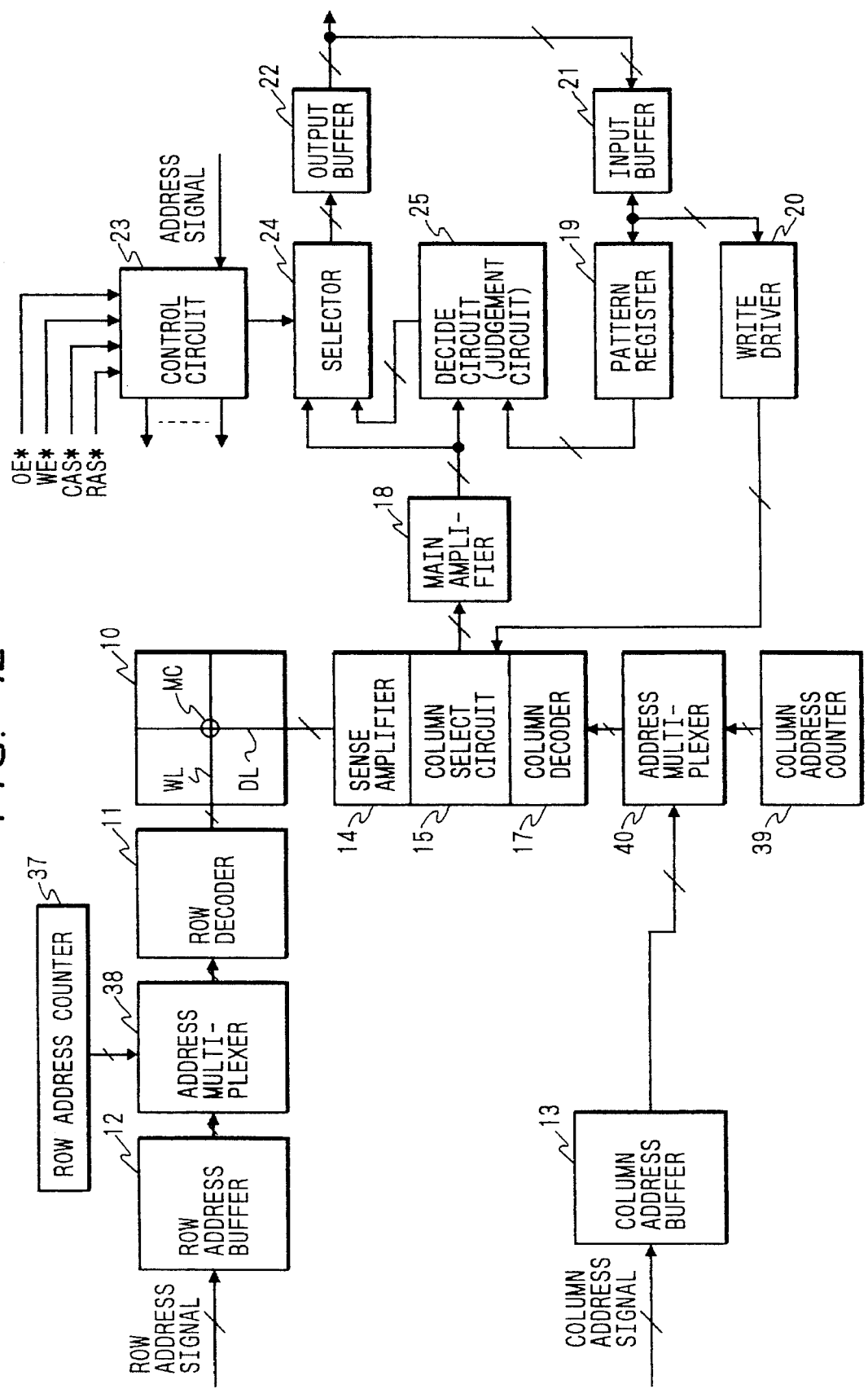
FIG. 12 is a block diagram showing a dynamic RAM according to still another embodiment of the present invention and explains one example of the structure having a testing address counter packaged therein.

The dynamic RAM shown in FIG. 12 includes: a row address counter 37 for generating row addresses; a column address counter 39 for generating column addresses; and address multiplexers 38 and 40 for feeding the output of the row address counter 37 and the output of the column address counter 39 in place of the input address signals from the outside to a downstream circuit. When the test mode is entered, the row address counter 37 and the column address counter 39 are set to initial values or preset from the outside. In the test mode, the output of the row address counter 37 is selected by the address multiplexer 38 and is transmitted to the row decoder 11. Likewise, the output of the column address counter 39 is selected by the address multiplexer 40 and is transmitted to the column decoder 17. In synchronism with the breaking timing or the like of the row address strobe signal RAS*, the row address counter 37 and the column address counter 39 are counted up to update the addresses. As a result, all the bits of the memory cell array 10 can be tested.

With the structure thus far made, too, effects similar to those of the foregoing embodiments can be attained. Since moreover, the row address counter 37 and the column address counter 39 are packaged to generate the address signals internally, no address signal need be fed in the test mode from the outside to raise an intrinsic effect that the address signals need not be inputted in the test mode from the outside.

[7] Pattern Register of Serial Input and Parallel Output Type

Figure 13:
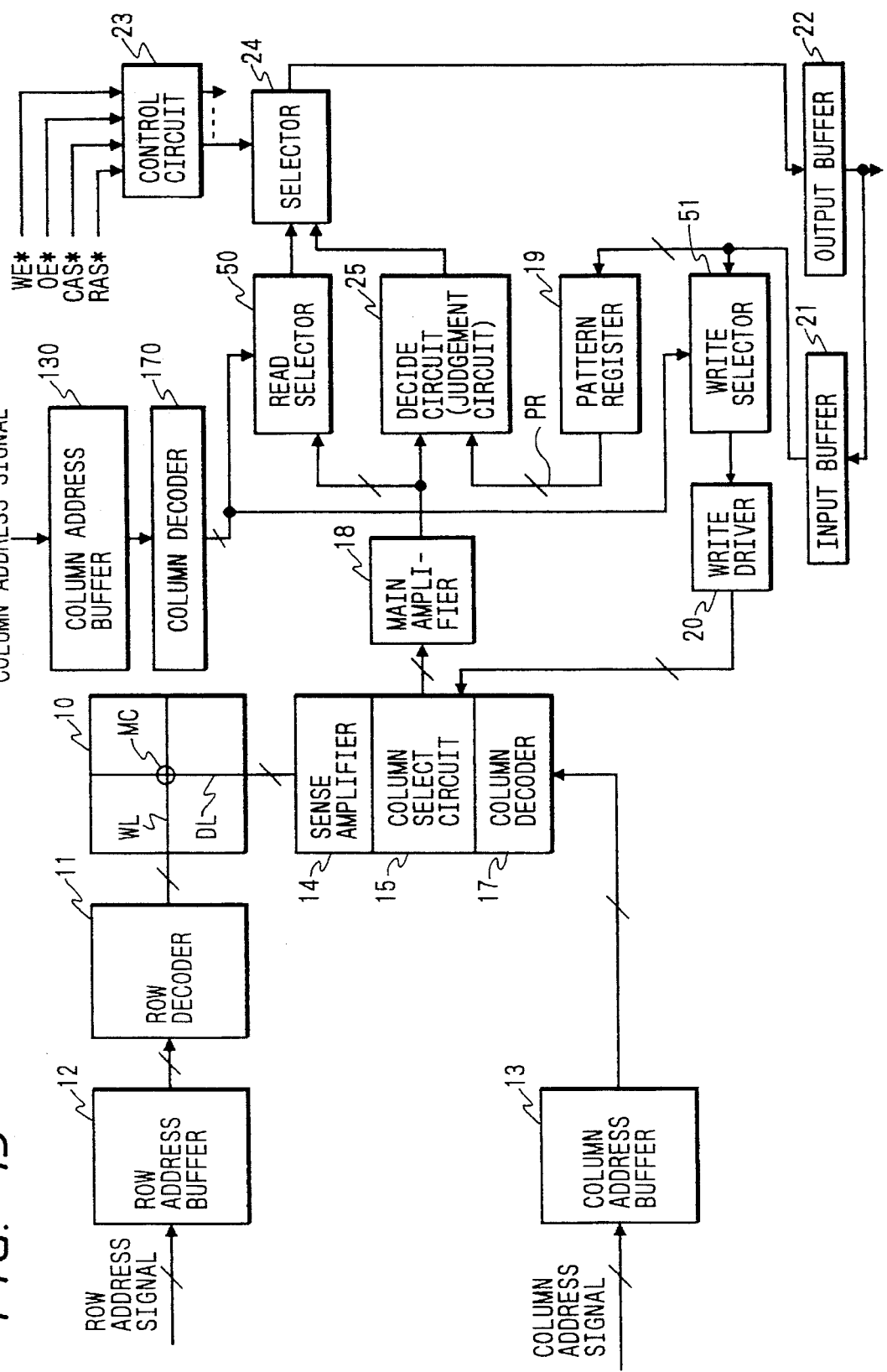
FIG. 13 is a block diagram showing a dynamic RAM according to a further embodiment of the present invention and explains one example of the structure adopting a pattern register of serial input and parallel output type.

FIG. 13 shows a dynamic RAM according to a further embodiment of the present invention.

The dynamic RAM shown in the same Figure is exemplified by changing the pattern register 19 into a shift register in the structure wherein the data are inputted or outputted at the unit of 1 bit for the outside. In the dynamic RAM shown in the same Figure, the reading line to the output of the main amplifier 18 and the writing line from the write driver 20 are identical to those of FIG. 1. The read data of 8 bits of the main amplifier 18 have their 1 bit selected by a read selector 50. The selected signal is generated by a column address buffer 130 fed with predetermined 3 bits of the column address signal and by a column decoder 170. The output of the read selector 50 and the output of the decide circuit 25 are selected by the selector 24 and fed to the output buffer 22. The data fed from the input buffer 21 is fed to a write selector 51 so that a circuit of 1 bit of the write driver 20 for feeding the write data on the basis of the output of the column decoder 170 is selected.

If the compression test mode is set in the dynamic RAM, the prospective data PD of totally 8 bits are serially inputted sequentially bit by bit in the first eight writing cycles until they are fed in parallel to the decide circuit 25. The writing operation of the test data is accomplished at the unit of 1 bit for the memory cells of eight consecutive addresses, and the compression reading operation is then accomplished in response to the address signal for designating any one of the eight memory cells. At this time, the eight memory cells are selected to that their data of 8 bits are fed as a whole to the decide circuit 25 through the main amplifier 18. The decide circuit 25 performs the same operation as that having been described with reference to FIG. 2, so that the decision result signal TOUT is selected by the selector 24 and read out to the tester. Subsequently, the data having all the eight bits of the test data logically inverted is used to perform the eight writing operations and one compression reading operation. These operations are subsequently repeated, if necessary. Thus, for the dynamic RAM having one input/output bit for the outside, only one compression reading may be performed for the eight test data writing operations so that the test can be efficiently accomplished by reducing the number of compression reading operations as a whole. Incidentally, the decide circuit of FIG. 3 may also be adopted in the circuit structure making use of the pattern register of serial input and parallel output type.

[8] Compression Circuit

Figure 14:
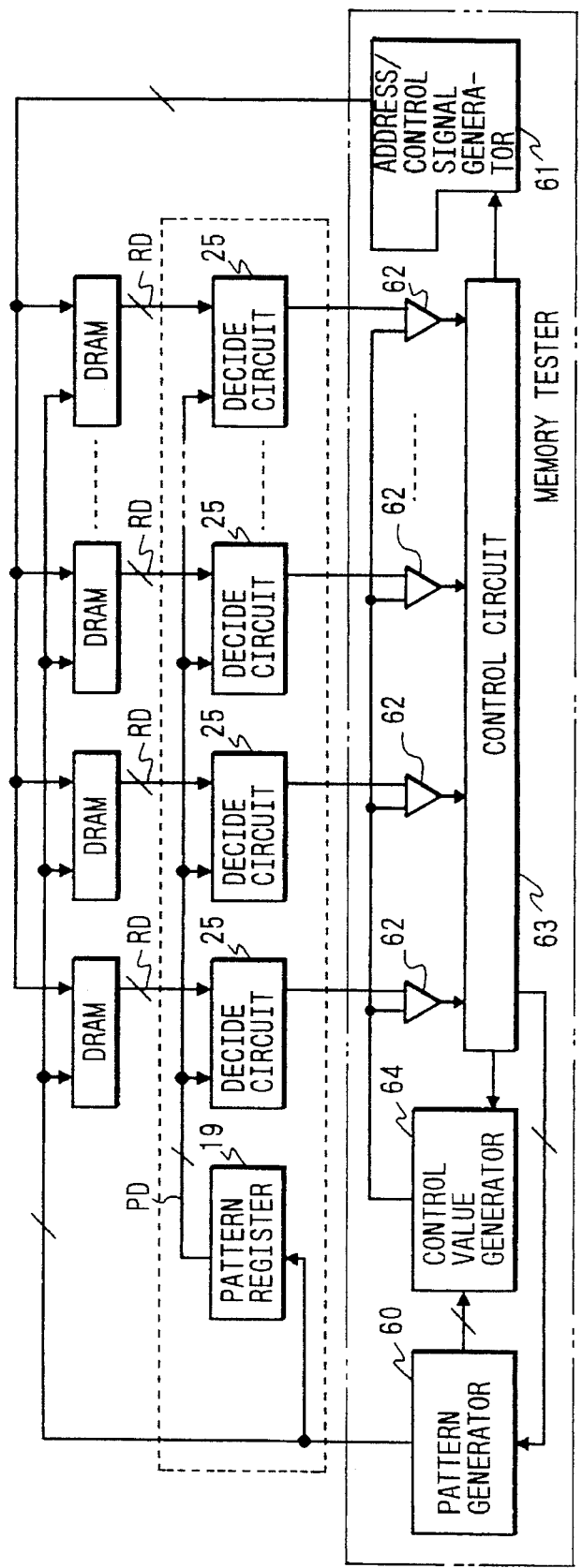
FIG. 14 is a block diagram showing one example of a compression circuit adopting a plurality of decide circuits.

FIG. 14 shows one embodiment of the compression circuit adopting a plurality of decide circuits.

Although the foregoing individual embodiments have made the compression test possible by packaging the decide circuit 25 and the pattern register 19 in the individual semiconductor integrated circuits, the embodiment of FIG. 14 is exemplified by realizing the function of the compression test as the packaged function of the tester or as the external circuit board for the tester. The compression circuit is equipped with a plurality of decide circuits 25 and one pattern register 19. The prospective data PD to be latched by the pattern register 19 is fed from a pattern generator 60, and the prospective data PD to be latched by the pattern register 19 is fed commonly to the individual decide circuits 25. The dynamic RAM to be tested is fed in parallel with the test data outputted from the pattern generator 60 and an address signal and an access control signal fed from an address/control signal generator 61. The read data RD outputted from the individual dynamic RAM are individually fed to the corresponding decide circuits 25. The compression outputs of the decide circuits 25 are individually fed to comparators 62. These comparators 62 are based on the decision reference data to compare which of the aforementioned three values is taken by the compression output, and output the results to a control circuit 63. The inverted reference data is one for indicating which of the logically non-inverted or inverted status the test data belongs to and is given from a prospective value generator 64. As a result, the control circuit 63 is based upon the information, which has been compressed to 1 bit by the individual decide circuits 25, to decide the propriety of the dynamic RAM likewise the description of FIG. 2. Incidentally, the decide circuits may adopt that shown in FIG. 3.

[9] Test Logic of Decide Circuit

Figure 16:
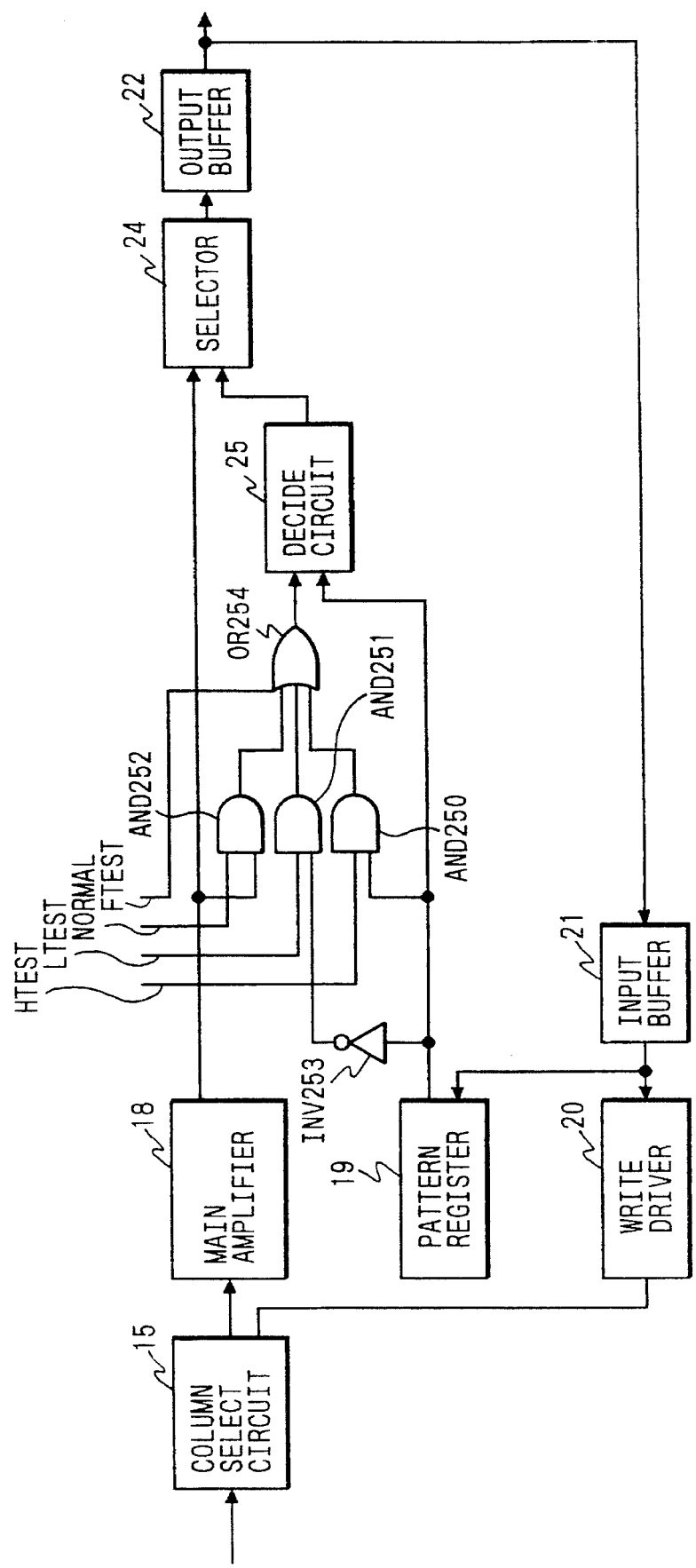
FIG. 16 is a logic circuit diagram showing one example of the test logic of a decide circuit.

FIG. 16 shows one example of the test logic of the decide circuit. In the same Figure, there is representatively shown the test logic for the individual outputs of 1 bit of the main amplifier 18 and the pattern register 19. This logic is composed of: an AND circuit AND250 made receptive of two inputs, i.e., the output of the pattern register 19 and a signal HTEST; an AND circuit 251 made receptive of two inputs, i.e., a signal inverted from the output of the pattern register 19 by an inverter INV253 and a signal LTEST; an AND circuit 252 made receptive of two inputs, i.e., the output of the main amplifier 18 and a signal NORMAL; and an OR circuit OR254 made receptive of four inputs, i.e., the outputs of the individual AND circuits AND250 to AND252 and a signal FTEST. The decide circuit 25 is fed with the output of the aforementioned OR circuit OR254 and the output of the pattern register 19. The aforementioned signal NORMAL makes it possible to perform the ordinary compression testing operations thus far described, by feeding the output of the main amplifier 18 to the decide circuit 25 in accordance with its high level. The signal HTEST forcibly establishes a status, in which the prospective data PD and the read data RD are coincident, by feeding the output of the pattern register 19 to both the two inputs of the decide circuit 25 in accordance with its high level. The signal LTEST forcibly establishes a status, in which the prospective data PD and the read data RD are logically inverted from each other, by feeding the non-inverted and inverted outputs of the pattern register 19 to the two inputs of the decide circuit 25 in accordance with its high level. The signal FTEST is one for forcibly establishing the aforementioned third status by taking a neither non-inverted nor inverted random value for the prospective data PD. By these test logics, the operation test of the decide circuit 25 can be accomplished. These test logics can also be adopted in the circuit shown in FIG. 14.

Although our invention has been specifically described in connection with its embodiments, it should not be restricted thereto but can naturally be modified in various manners without departing from the gist thereof.

For example, the number of bits of the pattern register or the decide circuit need not be limited to 8 but may be another suitable one. Moreover, the logic circuit for deciding the coincidence/incoincidence between the prospective data and the read data in the decide circuit should not be limited to the exclusive OR circuit but can adopt an exclusive negative OR circuit so that other logic circuits of the decide circuit may accordingly be constructed as negative ones. Moreover, a plurality of pattern registers 19 may be packaged and switched to change the testing data. Moreover, there may be packaged a ROM (i.e., Read Only Memory) which is written in advance with the testing data. If, moreover, registers or the like are packaged in the write driver 20, they can latch the testing data. Then, if the write enable signal WE* and the row address strobe signal RAS* are at the low level, the testing data can be written in the registers in the write driver 20 or in the pattern register 19. In case, moreover, only the row address strobe signal RAS* is at the low level, the read data from the memory cell array 10 and the latched data of the pattern register 19 may be compared by the decide circuit 25 to achieve the decide information.

Although our invention has been described mainly in case it is applied to its background field of the dynamic RAM, it should not be limited thereto but can be widely applied to a state RAM, another semiconductor memory or a logic LSI such as a microcomputer containing them.

The present invention can be applied to the condition, under which two kinds of test data having their logic values inverted and non-inverted with respect to at least one kind of prospective data can be utilized.

The effects obtainable from the representative of the invention to be disclosed herein will be briefly described in the following.

Specifically, the decide means decides the first status, in which the prospective data of the latch means and the read data of the memory cell array are coincident, the second status, in which the read data is coincident with the logically inverted data of the prospective data, and the third status other than the first and second statuses, and outputs the decided status in a discriminative manner so that it can output its own decision result with one kind of prospective data for the two kinds of test data in the non-inverted and inverted statuses of all the bits.

Since the information capable of discriminating the first to third statuses is sufficient if it has 2 bits or less, the test result can be compressed to 1 bit or 2 bits and outputted for the bit number capable of inputting/outputting the data in parallel. As a result, even if the number of the parallel output bits of the semiconductor integrated circuit to be tested is large, numerous semiconductor integrated circuits can be efficiently tested as a whole without being influenced by that number.

The circuit scale of the decide means can be reduced by constructing the second logic means of a fifth logic circuit which shares a plurality of fourth logic circuits such as exclusive OR circuits with the first logic means for discriminating whether or not the logic values of all the outputs of the plurality of fourth logic circuits adopt a constant logic value.

The compression result by the decide means can be easily reduced to 1 bit by adopting the output circuit which is made receptive of the first signal and the second signal for outputting the first to third statuses by discriminating them according to the high- and low-level and high-impedance status of the signal of 1 bit.

By exemplifying the prospective value latch means by a shift register of serial input and parallel output type, the number of reading operations can be reduced to improve the testing efficiency in case the bit number of the data obtained by one reading operation from the memory cell array is larger than that of the data to be inputted or outputted by the single writing operation from the outside for the memory cell array.

By making it possible to arbitrarily select the external terminal to be used for the external output of the decision result by the decide means, the memory test on a predetermined system can be easily accomplished by using the function of the compression test.

The burden on the tester can be lightened by packaging the address counter for generating addresses in response to the test.

Effects similar to the aforementioned ones can be obtained either by packaging the compression circuit adopting the decide means or the latch means in the tester or by adopting the same as an external circuit off the tester.

What is claimed is:

1. A semiconductor integrated circuit device comprising:
   a memory cell array comprising a plurality of memory cells storing data;
   a latch circuit latching first data and outputting said first data, said first data having a plurality of bits, said first data being inputted from outside of said device;
   a circuit writing said first data into predetermined memory cells in said plurality of memory cells; and
   a decide circuit receiving read data read out from said predetermined memory cells and receiving said first data outputted from said latch circuit,
   wherein said decide circuit compares said read data with said first data outputted from said latch circuit and outputs decide signals, said decide signals being a first state when said read data is coincident with said first data, said decide signals being a second state when said read data is coincident with a logically inverted data of said first data, and said decide signals being a third state when neither said read data is coincident with said first data nor said read data is coincident with the logically inverted data of said first data.

2. The semiconductor integrated circuit device according to claim 1, wherein said decide circuit includes:
a first logic circuit generating a first signal of 1 bit, said first signal being a first level when said read data is coincident with said first data or said read data is coincident with the logically inverted data of said first data, said first signal being a second level when neither said read data is coincident with said first data nor said read data is coincident with the logically inverted data of said first data; and
a second logic circuit generating a second signal of 1 bit, said second signal being a third level when said read data is coincident with said first data, said second signal being a fourth level when said read data is coincident with the logically inverted data of said first data, or said read data is not coincident with said first data.

3. The semiconductor integrated circuit device according to claim 2,
wherein said first logic circuit includes:
a selective logic inverter circuit inverting said read data of said memory cell array selectively at a bit unit in accordance with the logic values of each bit of said first data; and
a third logic circuit discriminating coincidence or incoincidence of all the bits of the outputs of said plurality of selective logic inverter, and
wherein said second logic circuit includes:
a fourth logic circuit deciding coincidence or incoincidence between said read data of said memory cell array and said first data; and
a fifth logic circuit for discriminating whether or not the logic values of all the outputs of said fourth logic circuit take a predetermined logic value.

4. The semiconductor integrated circuit device according to claim 3, wherein said selective logic inverter circuit includes:
a plurality of inverters for inverting the logic values of said read data of said memory cell array at a bit unit; and
a selector for selecting and for outputting either the output of said plurality of inverters or said read data at a bit unit, in accordance with said first data outputted from said latch circuit.

5. The semiconductor integrated circuit device according to claim 4, further comprising an output circuit outputting a signal having a high-level, a low-level or high-impedance statuses in accordance with said first signal and said second signal.

6. The semiconductor integrated circuit device according to claim 2,
wherein said first logic circuit includes:
a plurality of third logic circuits for deciding the coincidence or incoincidence of the logic values of the individual bits at a bit unit between said read data of said memory cell array and said first data outputted from said latch circuit; and
a fourth logic circuit discriminating coincidence or incoincidence of all the bits of the outputs of all said third logic circuits, and
wherein said second logic circuit includes a fifth logic circuit discriminating whether or not the logic values for all said outputs of said plurality of third logic circuits take a predetermined logic value.

7. The semiconductor integrated circuit device according to claim 6, further comprising an output circuit outputting a signal having a high-level, a low-level or high-impedance statuses in accordance with said first signal and said second signal.

8. The semiconductor integrated circuit device according to claim 2, further comprising an output circuit outputting a signal having a high-level, a low-level or high-impedance statuses in accordance with said first signal outputted from said first logic circuit and said second signal outputted from said second logic circuit.

9. The semiconductor integrated circuit device according to claim 8, wherein said latch circuit is a shift register of serial input and parallel output type.

10. The semiconductor integrated circuit device according to claim 8, further comprising:
a plurality of selectors selecting said signals outputted from said decide circuit and data read out from said memory cells; and
a control information latching circuit latching information for assigning and controlling a desired one of said plurality of selectors for the decision result output of said decide circuit and for feeding the information to each of said selectors.

11. The semiconductor integrated circuit device according to claim 10, further comprising an address counter for generating an address signal for sequentially selecting said memory cells in said memory cell array.

12. The semiconductor integrated circuit device according to claim 3, further comprising an output circuit outputting a signal having a high-level, a low level or high-impedance statuses in accordance with said first signal and said second signal.

13. An integrated circuit device comprising:
an external terminal;
a latch circuit receiving first data inputted from outside of said device, said first data having a plurality of bits, said latch circuit latching said first data;
a memory cell array having a plurality of word lines, a plurality of data lines and a plurality of memory cells, each of said plurality of memory cells being coupled to a corresponding one of said plurality of word lines and at least a corresponding one of said plurality of data lines;
a circuit writing said first data into predetermined memory cells in said memory cells in accordance with address signals inputted from outside of said device; and,
a circuit receiving first data outputted from said latch circuit and read data read out from said predetermined memory cells, setting said external terminal to a first level when each bit of said first data is coincident with each corresponding bit of said read data, setting said external terminal at a second level when each bit of said first data is coincident with a logical inversion of each corresponding bit of said read data and setting said external terminal to a high-impedance when at least one bit of said first data is coincident with a corresponding bit of said read data and at least another one bit of said first data is coincident with a logical inversion of a corresponding bit of said read data at the same time.

14. The semiconductor integrated circuit device according to claim 13, further comprising:
 a sense amplifier having input terminals coupled to said plurality of data lines of said memory cell array and having output terminals; and
 a main amplifier having input terminals coupled to said output terminals of said sense amplifier and having output terminals coupled to said input terminals of said circuit setting said external terminal at said first level, said sense amplifier amplifying data read out from said memory cells and outputting first amplified data to said output terminals of said sense amplifier, said main amplifier receiving said first amplified data outputted from said sense amplifier, amplifying said first amplified data and outputting second amplifying data to said outputs of said main amplifier.

15. The semiconductor integrated circuit device according to claim 14, wherein said first level is a high level and wherein said second level is a low level.

16. The semiconductor integrated circuit device according to claim 14, wherein said plurality of memory cells are of a dynamic type.

* * * * *